(12) United States Patent
Yoshihara et al.

(10) Patent No.: US 6,255,741 B1
(45) Date of Patent: Jul. 3, 2001

(54) SEMICONDUCTOR DEVICE WITH A PROTECTIVE SHEET TO AFFIX A SEMICONDUCTOR CHIP

(75) Inventors: Shinji Yoshihara, Nagoya; Sumitomo Inomata, Toyota; Kinya Atsumi, Okazaki; Minekazu Sakai, Kariya; Yasuki Shimoyama, Anjo; Tetsuo Fujii, Toyohashi, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/270,745

(22) Filed: Mar. 16, 1999

(30) Foreign Application Priority Data

Mar. 17, 1998 (JP) .................................................. 10-067276
Mar. 12, 1999 (JP) .................................................. 11-066948

(51) Int. Cl.⁷ .............................. G01P 1/00; H05K 7/20; H01L 23/12; H01L 23/48
(52) U.S. Cl. .......................... 257/792; 257/790; 257/666; 257/783; 257/788; 257/787; 257/698; 257/729; 257/687; 257/414; 257/467; 257/468; 257/469; 257/774; 257/676; 361/704
(58) Field of Search ..................................... 257/692, 666, 257/667, 676, 687, 698, 729, 774, 783, 784, 787, 788, 792, 790, 414, 467, 468, 469; 361/704

(56) References Cited

U.S. PATENT DOCUMENTS 5,250,843 * 10/1993 Eichelberger .......................... 257/693
5,331,203 * 7/1994 Wojnarowski et al. ............... 257/698
5,355,019 * 10/1994 Fuchs .................................... 257/698
5,362,681    11/1994 Roberts, Jr. et al. .
5,399,805 * 3/1995 Tyler et al. ........................... 257/787
5,435,876    7/1995 Alfaro et al. .
5,592,022 * 1/1997 Richards et al. ..................... 257/728
5,600,180 * 2/1997 Kusaka et al. ....................... 257/785
5,616,523    4/1997 Benz et al. .
5,723,353    3/1998 Muenzel et al. .
5,824,177    10/1998 Yoshihara et al. .
5,986,885 * 11/1999 Wyland ................................ 257/687
5,987,989 * 11/1999 Yamamoto et al. ................. 361/280
5,990,565 * 11/1999 Chang .................................. 257/778

FOREIGN PATENT DOCUMENTS

591554B1  4/1994  (EP) .
60-245260 12/1985  (JP) .
6-163938   6/1994  (JP) .
6-347475  12/1994  (JP) .
8-316496  11/1996  (JP) .
9-211022   8/1997  (JP) .
10-62448   3/1998  (JP) .

* cited by examiner

*Primary Examiner*—Alexander O. Williams
(74) *Attorney, Agent, or Firm*—Pillsbury Winthrop LLP

(57) ABSTRACT

A heat resisting resin sheet is bonded to a semiconductor chip as a protective cap for protecting a beam structure provided on the semiconductor chip, through a heat resisting adhesive. The heat resisting resin sheet is composed of a polyimide base member and the heat resisting adhesive is composed of silicone adhesive. The heat resisting resin sheet is not deformed during a manufacturing process of the semiconductor chip. In addition, grinding water does not invade into the semiconductor chip during dicing-cut.

36 Claims, 12 Drawing Sheets

SEMICONDUCTOR DEVICE WITH A PROTECTIVE SHEET TO AFFIX A SEMICONDUCTOR CHIP

CROSS REFERENCE TO RELATED APPLICATIONS

This application is based upon and claims the benefit of Japanese Patent Applications No. 10-67276, filed on Mar. 17, 1998, and No. 11-66948 filed on Mar. 12, 1999, the contents of which are incorporated herein by reference.

BACKGROUND OF THE INVENTION

1. Field of the Invention

This invention relates to a semiconductor device including a semiconductor chip covered with a protective sheet, and a method of manufacturing the same.

2. Description of the Related Art

Conventionally, a semiconductor physical quantity sensor such as a semiconductor acceleration sensor or a semiconductor pressure sensor includes a movable part formed on a silicon chip. Such a sensor outputs an electrical signal corresponding to a physical quantity such as acceleration or pressure, according to a displacement of the movable part.

For instance, JP-A-9-211022 discloses an acceleration sensor including a beam structure that is formed on a silicon substrate as a movable part and is displaced upon receiving an acceleration, a. movable electrode disposed on the beam structure, and a fixed electrode formed on the silicon substrate to face the movable electrode. The accelerating sensor detects acceleration based on a change in distance between the movable electrode and the fixed electrode.

This kind of semiconductor device usually includes a protective cap for covering and protecting the movable part. As disclosed in JP-A-6-347475, a glass substrate, which is bonded to a semiconductor wafer by anode coupling, can be used as the protective cap. In this case, however, the glass substrate is liable to form gaps at the bonding portion with the semiconductor wafer due to surface roughness of its bonding interface. Therefore, when dicing cut is carried out, grinding water easily enters into the semiconductor device through the gaps to cause various problems. For instance, the water may disturb the movement of the movable part due to surface tension thereof.

On the other hand, JP-A-9-27466 discloses not a glass substrate but an UV-hardening sheet as a protective cap. When the UV-hardening sheet is used as the protective cap, the problem such that grinding water enters into the semiconductor device during the dicing cut does not occur. However, the UV-hardening sheet is deformed at a temperature of approximately 8° C. to 90° C. Because of this, the UV-hardening sheet must be detached from the semiconductor device when subsequent steps such as a wire bonding step necessitating a temperature higher than that are carried out. This results in an increase in a number of manufacturing steps.

Further, there is a both-surface exposed type structure including a beam structure (movable part) as a sensing part that is exposed on both surfaces of a chip. In such a structure, when the chip is mounted on a lead frame by adhesive, or is fixed to a package by adhesive, the adhesive is liable to contact the sensing part to disturb the movement of the movable part. When the both-surface exposed type sensor chip is molded with resin, the resin easily contacts the movable part. Even when the sensor chip is fixed to the lead frame or the package, the resin can contact the movable part by passing through a gap at the bonding portion of the chip.

SUMMARY OF THE INVENTION

The present invention has been made in view of the above problems. An object of the present invention is to provide a semiconductor chip covered with a protective cap and capable of being manufactured at low cost with a small number of manufacturing steps. Another object of the present invention is to prevent adhesive and molding resin from adhering a movable part of a semiconductor chip during a manufacturing process.

According to the present invention, a main side protective resin sheet having an opening is bonded to a semiconductor chip to expose a pad on the semiconductor chip from the opening, through a main side heat resisting adhesive. The pad is connected to a wire. The main side protective resin sheet and the main side heat resisting adhesive have first and second heat resisting temperatures that are higher than a first temperature capable of fixing the wire to the pad by bonding. Because the main side protective resin sheet is bonded to the semiconductor chip by the heat resisting adhesive, grinding water does not invade through the bonding portion during dicing-cut. Because the first and second heat resisting temperatures are higher than the temperature capable of fixing the wire to the pad by bonding, the wire bonding can be carried out to the semiconductor chip without removing the main side protective resin sheet, resulting in decreased number of manufacturing steps.

The first and second heat resisting temperatures of the main side protective resin sheet and the main side heat resisting adhesive are higher than a temperature capable of fixing the semiconductor chip to a lead frame. Therefore, the semiconductor chip can be fixed to the lead frame without removing the protective resin sheet. The first and second heat resisting temperatures are higher than a temperature capable of molding the semiconductor chip with resin. Therefore, the semiconductor chip can be molded with resin without removing the protective resin sheet.

The first and second heat resisting temperatures are higher than a temperature capable of fixing the semiconductor chip to a package. Therefore, the semiconductor chip can be fixed to the package together with the protective resin sheet. Preferably, the main side protective resin sheet is made of polyimide, and the main side heat resisting adhesive includes a silicone adhesive.

When the semiconductor structure is exposed at both surfaces of the semiconductor chip, a back side protective resin sheet is further bonded to the semiconductor chip to cover the semiconductor structure on an opposite side of the main side protective resin sheet. The back side protective resin sheet can be bonded to the semiconductor chip by a back side heat resisting adhesive. Preferably, the back side protective resin sheet is made of polyimide and the back side heat resisting adhesive includes a silicone adhesive as well.

The back side protective resin sheet is resistible to the temperatures capable of bonding the wire to the pad, fixing the semiconductor chip to the lead frame, molding the semiconductor chip with resin, and fixing the semiconductor chip to the package, as well as the main side protective sheet and the main side heat resisting adhesive. That is, the main side and back side protective resin sheets are not thermally deformed at the temperatures described above. This allows the resin sheets to remain on the semiconductor chip during the manufacturing steps described above. Even when the semiconductor structure is exposed on the both surfaces of the semiconductor chip, because the semiconductor structure is covered by the main side and back side protective sheets, the adhesive and resin does not contact the semiconductor structure during the manufacturing steps. Further, the invasion of grinding water during dicing-cut can be prevented.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS

First Embodiment

Figure 1:
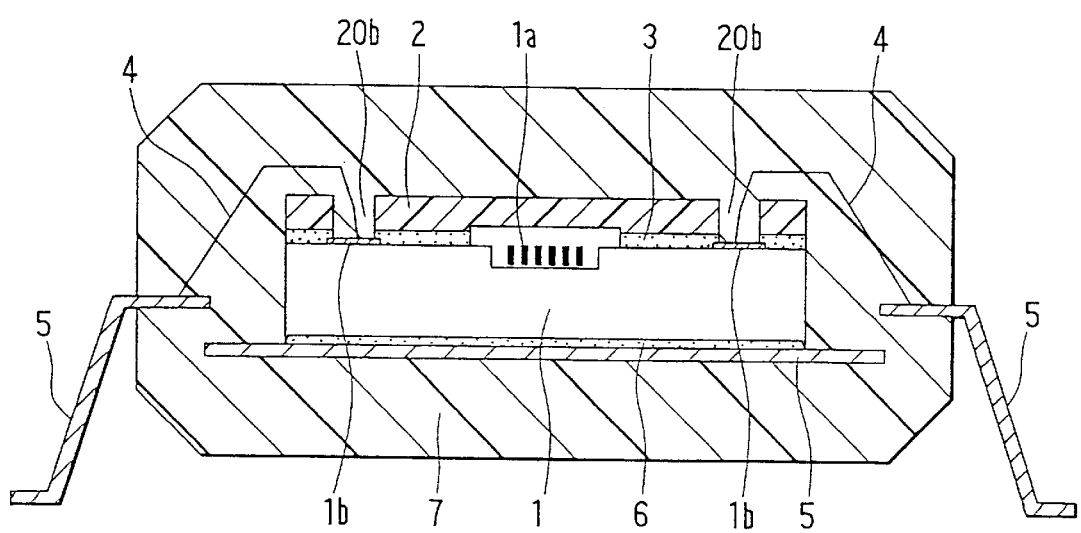
FIG. 1 is a cross-sectional view showing a semiconductor acceleration sensor in a first preferred embodiment.

Referring to FIG. 1, a semiconductor acceleration sensor in a first preferred embodiment includes a sensor chip 1 encapsulated with a resin by molding. The sensor chip 1 has a structure substantially the same as that disclosed in JP-A-211022. Briefly, a beam structure that is displaced as a movable part upon receiving acceleration is formed on a silicon substrate, and the acceleration is detected based on a change in distance between a movable electrode provided on the beam structure and a fixed electrode provided on the silicon substrate. In FIG. 1, only the beam structure is indicated with reference numeral 1a. Pads 1b are formed on the surface of the sensor chip 1 so that the movable electrode and the fixed electrode are electrically connected to an external circuit.

A heat resisting resin sheet 2 for protecting the beam structure 1a as a protective cap is bonded to the surface of the sensor chip 1 by heat resisting adhesive 3. The heat resisting adhesive 3 is resistible to heat treatment temperatures (for instance, 150° C.–180° C.) for a wire bonding step and a resin molding step described below. Specifically, the heat resisting resin sheet 2 is made of polyimide base material having a heat resisting temperature of approximately 400° C., and the heat resisting adhesive 3 is silicone adhesive having a heat resisting temperature of approximately 230° C. This means that the polyimide base material is not deformed at a temperature equal to or lower than 400° C., and the silicone adhesive is not deformed at a temperature equal to or lower than 230° C.

The heat resisting resin sheet 2 has contact holes 20b for exposing the pads 1b therefrom so that the pads 1 are connected to a lead frame 5 via wires 4 by bonding. The sensor chip 1 is fixedly attached to the lead frame 5 through silver paste 6, and the sensor chip 1 and the lead frame 5 are entirely encapsulated with resin 7 by molding.

Next, a method of manufacturing the acceleration sensor will be explained referring to FIGS. 2A to 2E.

Figure 2A:
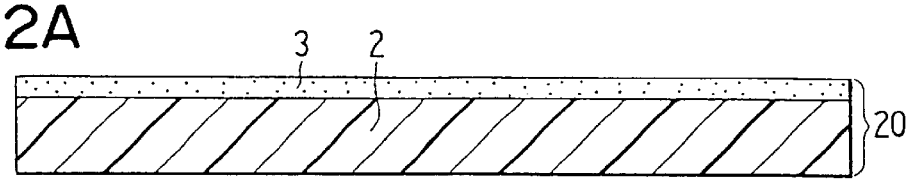
FIGS. 2A to 2E are cross-sectional views showing a manufacturing method of the acceleration sensor shown in FIG. 1 in a stepwise manner.

[Step shown in FIG. 2A]

A heat resisting adhesive sheet 20 including a polyimide base member 2 coated with the silicone adhesive 3 is prepared. A thickness of the polyimide base member 2 is preferably in a range of 50 μm to 150 μm for facilitating dicing in a subsequent step, and a thickness of the silicone adhesive 3 is preferable in a range of 10 μm to 20 μm.

Figure 2B:
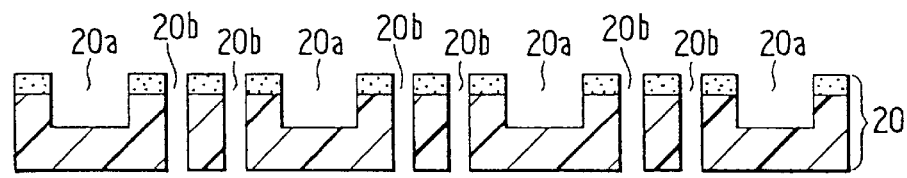

[Step shown in FIG. 2B]

Figure 2C:
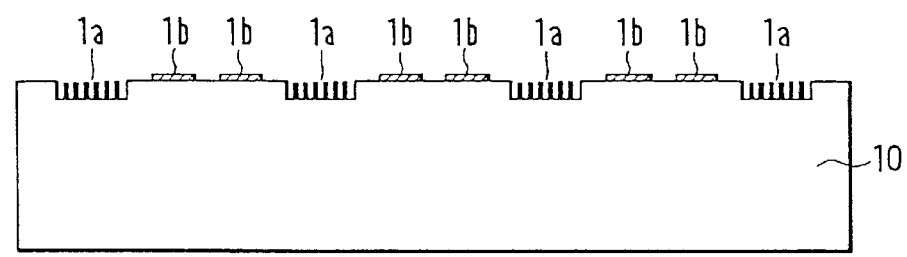
Figure 2D:
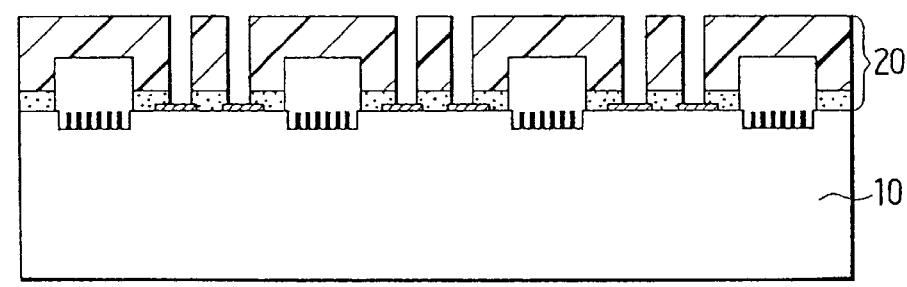

Recesses 20a are formed on the heat resisting adhesive sheet 20 so that beam structures 1a can be prevented from contacting the heat resisting adhesive sheet 20 at a step shown in FIG. 2D in which the heat resisting adhesive sheet 20 is bonded to a semiconductor wafer 10. The recesses 20a are formed by using excimer laser while controlling a number of shot times to obtain desired depths thereof. It is conceivable for improving throughput of the processing to broaden the laser beam by a mask, to partition the laser beam into several beams, or to increase a number of laser generators.

Further, the contact holes 20b are formed in the heat resisting adhesive sheet 20 at positions corresponding to the pads 1b of the semiconductor wafer 10. The processing of the contact holes 20b may be performed by excimer laser or by stamping. Each open area of the contacts holes 20b may be smaller or larger than that of the respective pads 1b, provided that wire bonding is carried out thereon. The order for forming the recesses 20a and the contact holes 20b are not fixed, and the contact holes 20b may be formed before forming the recesses 20a.

Figure 3:
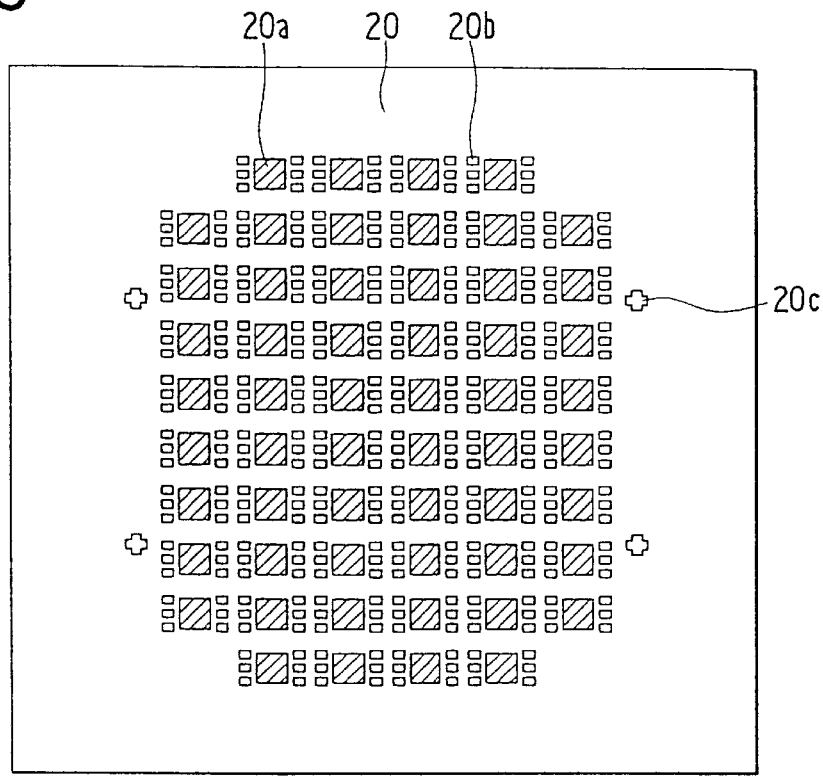
FIG. 3 is a plan view schematically showing a plan configuration of a heat resisting adhesive sheet in the first embodiment.

FIG. 3 shows a plan configuration of the heat resisting adhesive sheet 20. The recesses 20a and the contact holes 20b are formed to correspond to positions where sensor chips are to be formed on the semiconductor wafer 10. Further, alignment keys (marks) 20c are formed on the heat resisting adhesive sheet 20 for alignment relative to the semiconductor wafer 10. The alignment keys 20c are through holes formed by excimer laser.

[Step shown in FIG. 2C]

Figure 4:
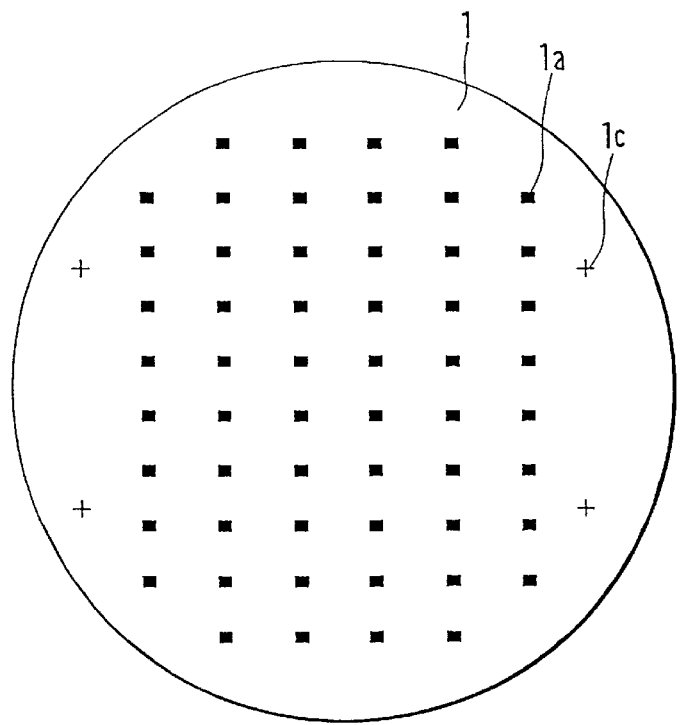
FIG. 4 is a plan view schematically showing a plan configuration of a semiconductor wafer in the first embodiment.

Next, the semiconductor wafer 10 on which the beam structures 1a and the aluminum (Al) pads 1b are formed is prepared. FIG. 4 shows a plan configuration of the semiconductor wafer 10. As shown in the figure, alignment keys 1c are formed for alignment relative to the heat resisting adhesive sheet 20. In FIG. 4, the pads 4 are omitted.

[Step shown in FIG. 2D]

The heat resisting adhesive sheet 20 is bonded onto the surface of the semiconductor wafer 10 so that each of the alignment keys 20c of the heat resisting adhesive sheet 20 fits a corresponding one of the alignment keys 1c of the semiconductor wafer 10. Accordingly, the beam structures 1a are accommodated in the recesses 20a, respectively.

At the bonding step, a heated roller or the like may be rolled on the heat resisting adhesive sheet 20 to heat the sheet 20, or a roller or the like may be rolled on the heated semiconductor wafer 10 in order to prevent generation of voids and in order to improved adhesive strength of the adhesive. The alignment of the heat resisting adhesive sheet 20 and the semiconductor wafer 10 may be carried out using a CCD camera disposed between the heat resisting adhesive sheet 20 and the semiconductor wafer 10 before bonding. In some cases, the width of the heat resisting adhesive sheet 20 may be narrowed as compared to that of the semiconductor wafer 10 so that a scribe pattern and the like are exposed. Accordingly, it is easily checked after bonding whether the heat resisting adhesive sheet 20 and the semiconductor wafer 10 are securely bonded to one another at specific positions. In addition, subsequent steps can be smoothly carried out.

Figure 2E:
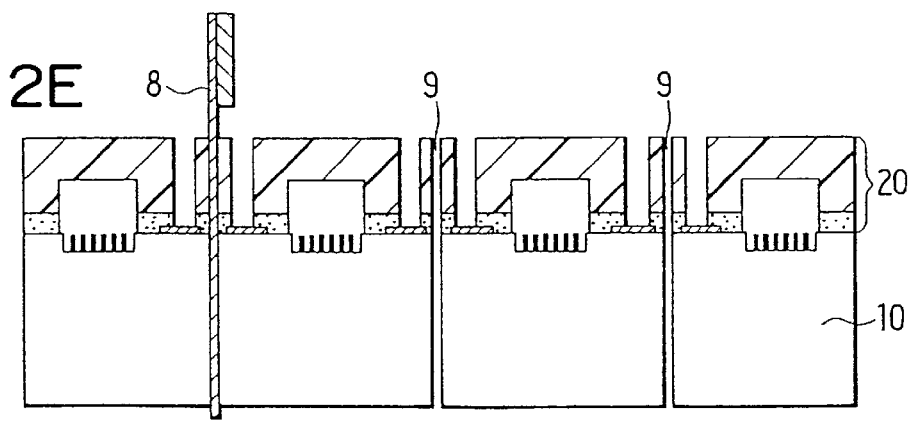

[Step shown in FIG. 2E]

Figure 5:
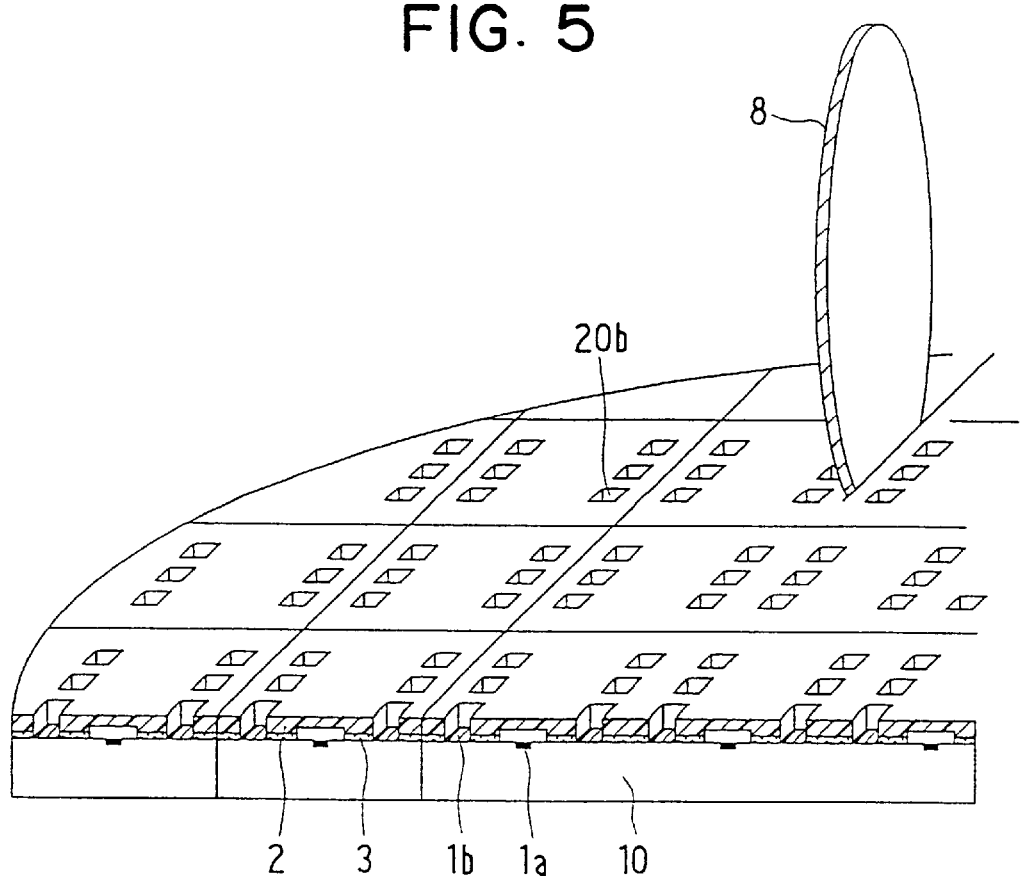
FIG. 5 is a perspective view showing a state where dicing-cut is carried out in the first embodiment.

The semiconductor wafer 10 is divided into the sensor chips 1 by dicing-cut along the scribe pattern with the pads 1b that are exposed from the contact holes 20b and serve as a reference. FIG. 5 shows a state where the semiconductor wafer 10 is cut by a dicing blade 8. In FIG. 2E, reference numeral 9 indicates cut portions cut by the dicing blade 8.

After that, as shown in FIG. 1, one of the sensor chips 1 cut by dicing is fixed to the lead frame 5 by silver paste 6. The pads 1b are electrically connected to the lead frame 5 through the wires 4 by wire-bonding, and then, the semiconductor acceleration sensor is molded with resin 7.

In the manufacturing method described above, when the sensor chip 1 is fixed to the lead frame 5 by the silver paste 6, a heat treatment is performed at approximately 150° C. When the wire-bonding is performed using the wires 4, another heat treatment is performed at approximately 150° C. Further, when the molding using the resin 7 is performed, a heat treatment is performed at approximately 180° C. To the contrary, as described above, the heat resisting temperature of the polyimide base member 2 is approximately 400° C., and the heat resisting temperature of the silicone adhesive 3 is approximately 230° C. Therefore, the semiconductor acceleration sensor can be manufactured while keeping the shape of the heat resisting adhesive sheet 20. Incidentally, the semiconductor wafer 10 is attached to an adhesive sheet at the dicing step; however, an explanation concerning the adhesive sheet is omitted in the manufacturing method described above.

Second Embodiment

In the first embodiment, after the contact holes 20b are formed in the heat resisting adhesive sheet 20, the heat resisting adhesive sheet 20 is bonded to the semiconductor wafer 10; however, the contact holes 20b may be formed after the heat resisting adhesive sheet 20 is bonded to the semiconductor wafer 10 as follows.

The method of manufacturing the semiconductor acceleration sensor in this manner will be explained referring to FIGS. 6A to 6D. First, as in the first embodiment, the heat resisting adhesive sheet 20 composed on the polyimide base member 2 on which the silicone adhesive 3 is coated is prepared as shown in FIG. 6. Then, as shown in FIG. 6B, the recesses 20a are formed on the heat resisting adhesive sheet 20. After that, as shown in FIG. 6C, the heat resisting adhesive sheet 20 is bonded onto the surface of the semiconductor wafer 10 after alignment is carried out so that the beam structures 1a are accommodated in the recesses 20a of the heat resisting adhesive sheet 20.

Next, the contact holes 20b are opened in the heat resisting adhesive sheet 20 by excimer laser to expose the pads 1b therefrom for wire bonding. When the pads 1b are made of aluminium (Al), processing threshold values of the heat resisting adhesive sheet 20 and Al are different from one another, thereby providing high selectivity. Therefore, as soon as the pads 1b are exposed, an etching rate by excimer laser is suddenly decreased or becomes zero. After that, as in the first embodiment, dicing-cut is carried out to form the individual sensor chips 1, and finally the semiconductor acceleration sensor shown in FIG. 1 is completed.

Third Embodiment

In the first and second embodiments, the recesses 20a are formed on the heat resisting adhesive sheet 2 to accommodate the beam structures therein; however, through holes may be formed in the heat resisting adhesive sheet 20 to form the recesses with another heat resisting adhesive sheet.

Figure 7A:
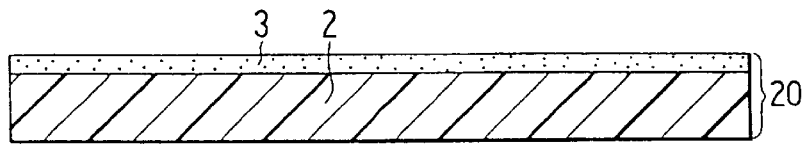
FIGS. 7A to 7D are cross-sectional views showing a manufacturing method of a semiconductor acceleration sensor in a third preferred embodiment in a stepwise manner.
Figure 7B:
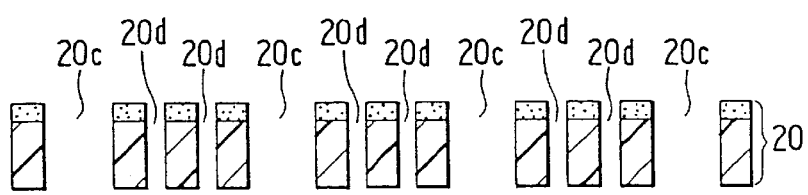

The manufacturing method in this case will be specifically explained referring to FIGS. 7A to 7D. First, a first heat resisting adhesive sheet 20 including the polyimide base member 2 and the silicone adhesive 3 coated on the polyimide base member 2 is prepared as shown in FIG. 7A. The thickness of the polyimide base member 2 is preferably in a range of 50 $\mu$m to 150 $\mu$m, and the thickness of the silicone adhesive 3 is preferably in a range of 10 $\mu$m to 20 $\mu$m. Then, as shown in FIG. 7B, through hole portions 20c and contact holes 20d for the pads 1b are formed in the heat resisting adhesive sheet 20 by excimer laser, stamping, or the like.

Figure 7C:
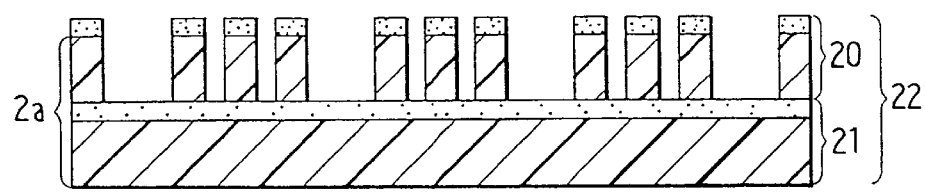

Subsequently, a second heat resisting adhesive sheet 21 having substantially the same constitution as that shown in FIG. 7A is prepared, and, as shown in FIG. 7C, it is integrated with the first heat resisting adhesive sheet 20 by adhesion, thereby forming a heat resisting adhesive sheet 22. Accordingly, the through hole portions 20c become apparent recesses. In the heat resisting adhesive sheet 22, the polyimide base member 2 of the first heat resisting adhesive sheet 20, and the second heat resisting adhesive sheet 21 cooperatively serve as a heat resisting resin sheet 2a.

Figure 7D:
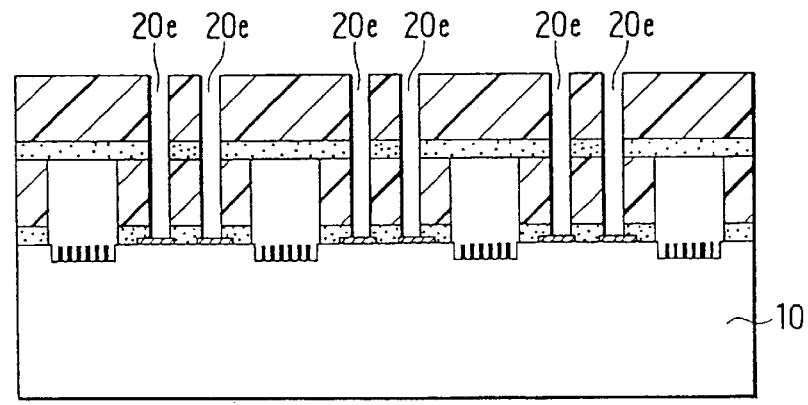

Then, the heat resisting adhesive sheet 22 is boned onto the surface of the semiconductor wafer 10 so that the beam structures are accommodated in the apparent recesses, respectively. Then, as shown in FIG. 7D, holes are formed in the second heat resisting adhesive sheet 21 by excimer laser to communicate with the contact holes 20b in the first heat resisting adhesive sheet 20, respectively, thereby forming contact holes 20e exposing the pads therefrom. The contact holes 20e may be formed by cutting the first heat resisting adhesive sheet 21 using a dicing blade with a cut width which do not adversely affect the wire bonding. After that, as in the first embodiment, the semiconductor wafer is divided into individual sensor chips by dicing-cut, and the semiconductor acceleration sensor shown in FIG. 1 is completed. Thus, in the third embodiment, the recesses for accommodating the beam structures therein can be easily formed utilizing the through holes formed in the heat resisting adhesive sheet.

In the first to third embodiments described above, the heat resisting adhesive sheet including the heat resisting resin member coated with the heat resisting adhesive is bonded to the semiconductor wafer. Alternatively, after the heat resisting adhesive is printed on either one of the heat resisting resin sheet and the semiconductor wafer by screen printing or the like, the two members may be bonded to one another.

Fourth Embodiment

Figure 8:
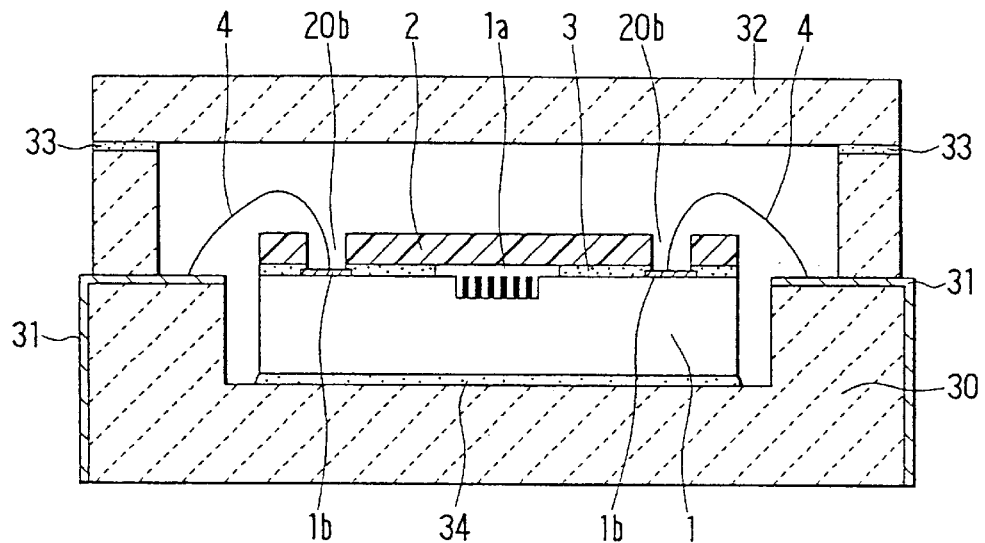
FIG. 8 is a cross-sectional view showing a semiconductor acceleration sensor in a fourth preferred embodiment.

The semiconductor acceleration sensor shown in FIG. 1 is encapsulated with resin by molding; however, the sensor chip 1 may be accommodated in a ceramic package as shown in FIG. 8. In FIG. 8, the constitution of the sensor chip 1a including the beam structure 1a protected by the heat resisting adhesive sheet 2 is substantially the same as that shown in FIG. 1. The sensor chip 1 is accommodated in a recess portion of a ceramic package body 30. The package body 30 holds metallic wires 31 that pass through the package body 30 and electrically connect the pads 1b of the sensor chip 1 and an external circuit. A ceramic lid portion 32 is attached to the package body 30 by adhesive 33, thereby hermetically sealing the inside the package. Incidentally, the sensor chip 1 is fixed to the package body 30 by silver paste 34.

In the manufacturing method of the semiconductor acceleration sensor having the constitution described above, when the sensor chip 1 is fixed to the package body 30 by the silver paste 34, a heat treatment is performed at approximately 150° C. At the bonding step of the wires 4, likewise, a heat treatment is performed at approximately 150° C. Further, when the lid portion 32 is attached to the package body 30, a heat treatment is performed at approximately 180° C. In these heat treatments, the shape of the polyimide base member 2 can be kept similarly to the first embodiment, because the heat resisting temperatures of the polyimide base member 2 and the silicone adhesive 3 are higher than the heat treatment temperatures described above.

The manufacturing method and configuration of the heat resisting adhesive sheet in the second or third embodiment can be adopted to those in this embodiment as well. When the silicone adhesive includes silanol radicals (Si—OH), the heat resistivity can be more improved. Polyimide adhesive may be used in place of the silicone adhesive.

Fifth Embodiment

In fifth to eighth embodiments described below, the present invention is applied to a semiconductor device including a both-surface exposed type semiconductor chip with a structure, both surfaces of which are exposed.

Figure 9:
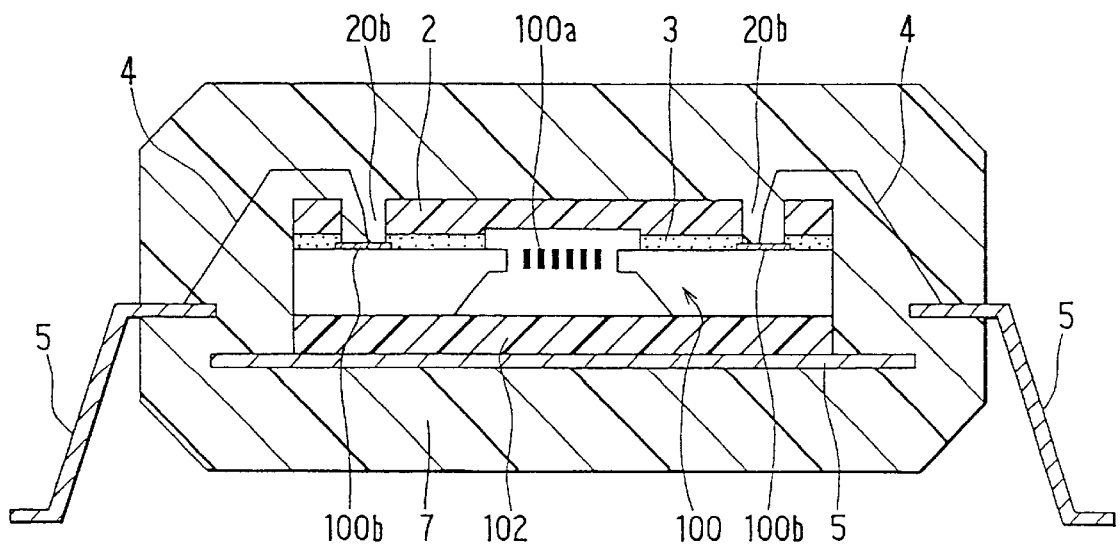
FIG. 9 is a cross-sectional view showing a semiconductor acceleration sensor in a fifth preferred embodiment.

FIG. 9 shows a semiconductor acceleration sensor in the fifth embodiment, in which a sensor chip 100 is molded with resin 7. Herebelow, the same parts and components as in the first to fourth embodiments will be indicated by the same reference numerals. Referring to FIG. 9, the sensor chip 100 includes an SOI substrate and the like, and a beam structure 100a having a constitution substantially the same as that of the beam structure 1a shown in FIG. 1 is formed on the substrate using micro-machine techniques, photo-lithography technique, and the like. The beam structure 100a is exposed on both sides of a main surface (upper face in FIG. 9) and a back surface (lower face in FIG. 9) of the sensor chip 100.

A heat resisting resin sheet 2 shown in FIG. 1 is bonded to the main surface of the sensor chip 100 as a main surface protective cap for protecting the beam structure 100a, through heat resisting adhesive 3 shown in FIG. 1. Herebelow, the heat resisting resin sheet 2 is represented as a first heat resisting resin sheet 2 to differentiate from a second heat resisting resin sheet 102 described below. The first heat resisting resin sheet 2 has contact holes 20a for exposing therefrom pads 100a that are formed on the surface of the sensor chip 100. The pads 100b are connected to a lead frame 5 through wires 4 by bonding. The pads 100b are substantially similar to the pads 1b shown in FIG. 1.

The second resisting resin sheet 102 is disposed on the back surface of the sensor chip 100 as a back surface protective cap for protecting the beam structure 100a. The second resisting resin sheet 102 is softened by heating to exhibit adhesion, thereby being attached to the back surface of the sensor chip 100. The second resisting resin sheet 102 covers the generally entire region of the back surface of the sensor chip 100 in order to protect the beam structure 100a.

The first and second heat resisting resin sheets 2, 102, and the heat resisting adhesive 3 have heat resistant characteristics substantially the same as those of the heat resisting resin sheet and the heat resisting adhesive described in the first embodiment. Specifically, the first and second heat resisting resin sheets 2, 102 respectively include polyimide base members, and the heat resisting adhesive is composed of silicone adhesive or polyimide adhesive.

The sensor chip 100 is fixed to the lead frame 5 by the second heat resisting resin sheet 102, and is entirely molded with the resin 7. The second heat resisting resin sheet 102 may be composed of a polyimide adhesive film, which is softened by heating to exhibit adhesion.

Next, a manufacturing method of the acceleration sensor shown in FIG. 9 will be explained referring to FIGS. 10A to 10D. Points of this manufacturing method different from that shown in FIGS. 2A to 2E in the first embodiment are that the method is applied to the both-surface exposed type semiconductor chip, and that the second heat resisting resin sheet 102 is provided on the back surface of the chip.

Figure 10A:
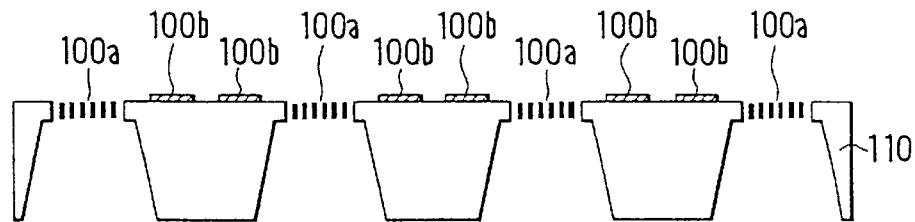
FIGS. 10A to 10D are cross-sectional views showing a manufacturing method of the acceleration sensor shown in FIG. 9, in the fifth embodiment.
Figure 11:
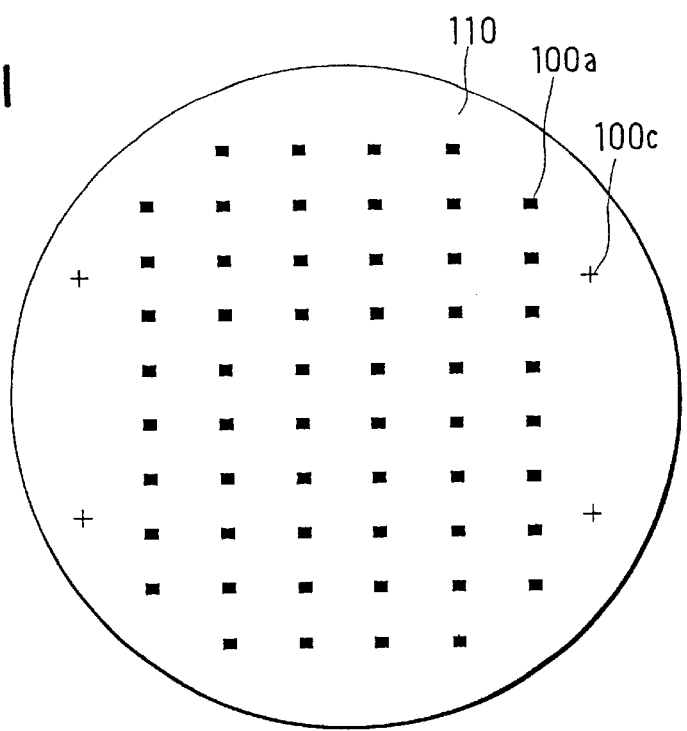
FIG. 11 is a plan view schematically showing a plan configuration of a semiconductor wafer in the fifth embodiment.

First, at a step shown in FIG. 10A, a semiconductor wafer 110 on which beam structures 100a exposed at main and back surfaces of the wafer 110 and the aluminium pads 100b are formed is prepared. FIG. 11 shows a plan configuration of the semiconductor wafer 110, although it omits the pads 100b therefrom. As shown in the figure, the beam structures 100a are formed at positions corresponding to chips, and alignment keys 100c are formed for alignment relative to a heat resisting adhesive sheet 20.

Figure 10B:
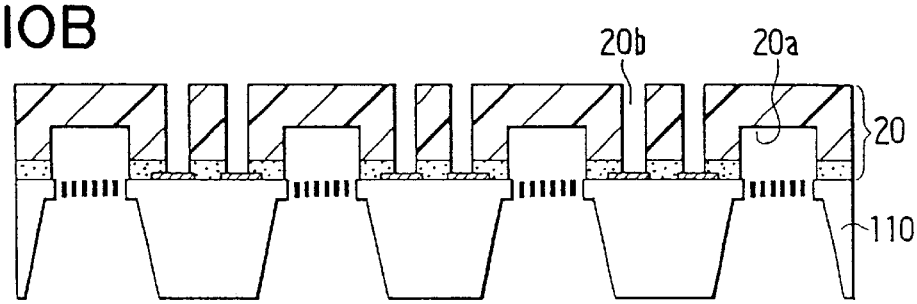

At a step shown in FIG. 10B, the heat resisting adhesive sheet 20 is bonded to the main surface of the semiconductor wafer 110 in the manner substantially the same as that of the step shown in FIG. 2C. Incidentally, the heat resisting adhesive sheet 20 is composed of the first heat resisting resin sheet 2 made of a polyimide base member coated with the heat resisting adhesive 3 made of silicone adhesive, and has the recesses 20a, the contact holes 20b, and the alignment keys 20c thereon formed at the steps shown in FIGS. 2A and 2B. Accordingly, the first heat resisting resin sheet 2 is bonded to the semiconductor wafer 110 with the heat resisting adhesive 3 interposed therebetween.

Figure 10C:
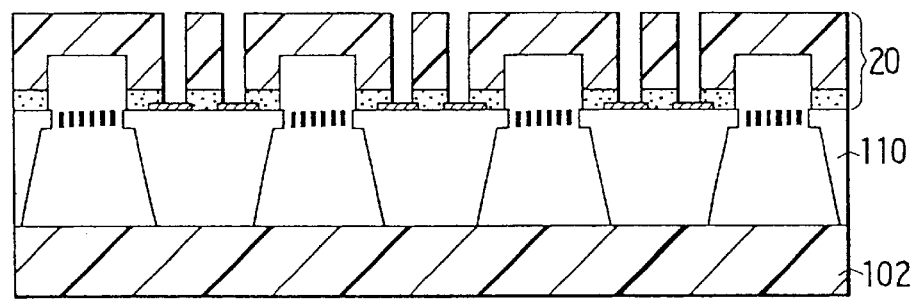

Next, at a step shown in FIG. 10C, the second heat resisting resin sheet 102 that is composed of a polyimide base member having an area sufficient for covering the entire back surface of the semiconductor wafer 110 is softened by heating and is bonded to the back surface of the semiconductor wafer 110. At that time, because the beam structure (sensing part) 100a is protected by the heat resisting adhesive sheet 20 on the main surface of the wafer 110, the second heat resisting resin sheet 102 can be easily attached to the wafer 110 which is made upside down.

Figure 10D:
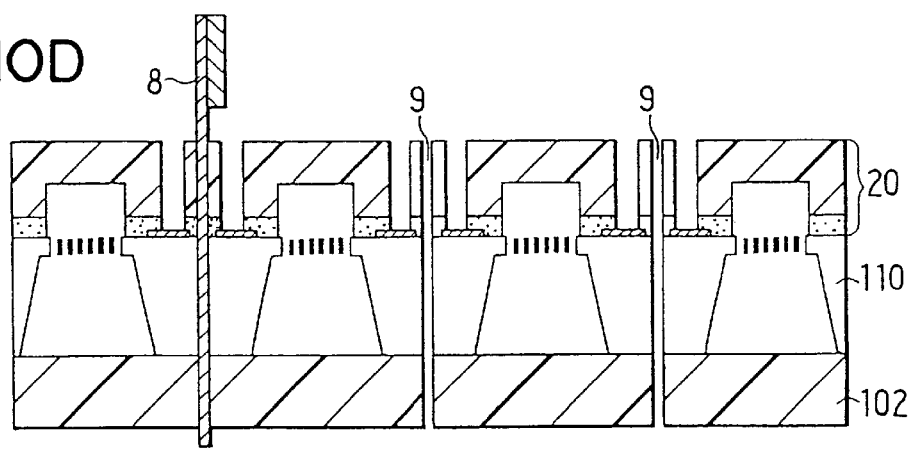
Figure 12:
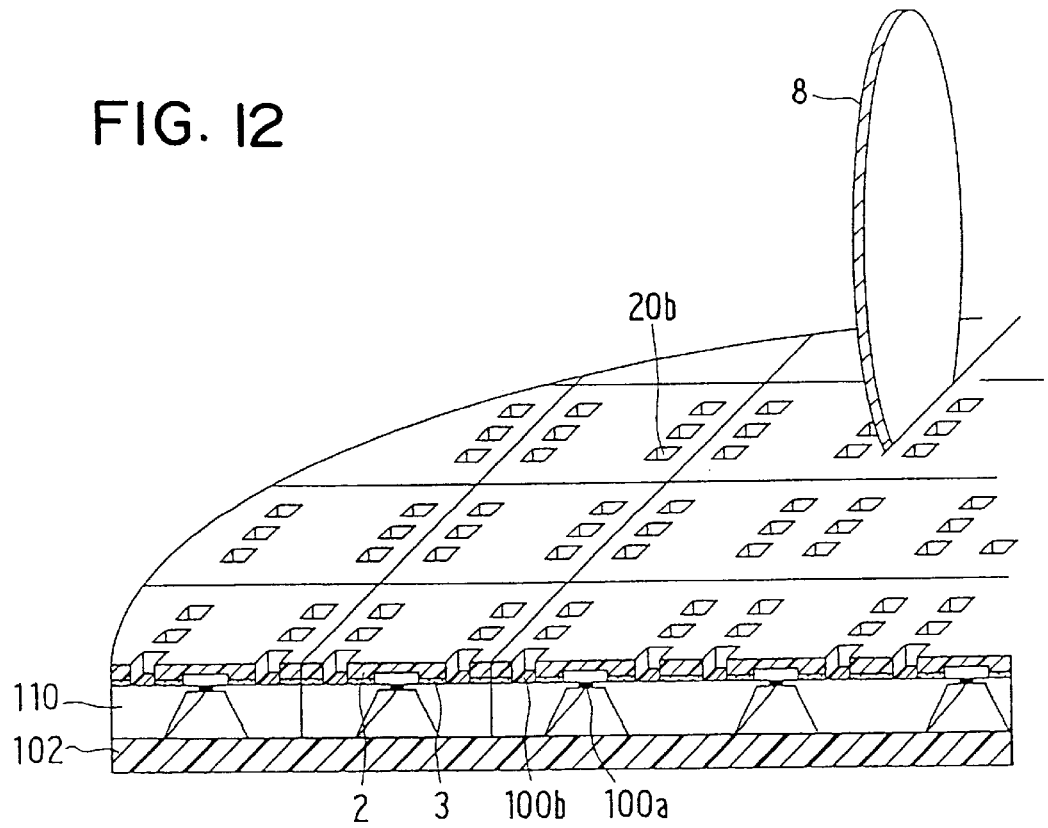
FIG. 12 is a perspective view showing a state where dicing-cut is carried out in the fifth embodiment.

Then, at a step shown in FIG. 10D, the semiconductor wafer 110 to which the first and second heat resisting resin sheets 2, 102 are bonded is divided into chips by dicing-cut. This dicing cut is carried out substantially in the same manner as that shown in FIG. 2E. FIG. 12 shows a state where the wafer 110 is cut by a dicing blade 8. After that, one of the chips 100 divided by dicing-cut is, as shown in FIG. 9, fixed to the lead frame 5 by softening the second heat resisting resin sheet 102 to adhere to the lead frame 5. Further, after the pads 100b are connected to the lead frame 5 via the wires 4 by bonding, the sensor chip 100 is molded with the resin 7, thereby completing the semiconductor acceleration sensor.

In the manufacturing method described above, when the sensor chip 100 is fixed to the lead frame 5, a heat treatment is performed at approximately 180° C. At the bonding step of the wires 4, another heat treatment is performed at approximately 150° C. Further, at the resin molding step, a heat treatment is performed at approximately 180° C. However, as in the first embodiment, the shapes of the first and second heat resisting resin sheets 2, 102 are kept during these heat treatments, because the polyimide base members constituting the first and second heat resisting resin sheets 2, 102 have a heat resisting temperature of approximately 400° C.

In addition, in this embodiment, since the back surface side of the sensor chip 100, on which the beam structure 100a is exposed, is bonded to the lead frame 5 by the second heat resisting resin sheet 102, die-mounting of the sensor chip 100 to the lead frame 5 can dispense with any adhesive, thereby preventing a problem such that adhesive adheres to the beam structure 100a. Further, when the chip 100 is molded with resin 7, the resin 7 does not adhere to the beam structure 100a by invading from the back surface of the sensor chip 100 due to the existence of the second heat resisting resin sheet 102. In this embodiment, the first and second heat resisting resin sheets 2, 102 are respectively composed of transparent polyimide base members. Therefore, a movable electrode of the beam structure 100a and a fixed electrode can be observed through the sheets 2, 102. This enables a visual inspection in a state where the sheets, i.e., the protective caps are attached to the sensor chip 100.

Sixth Embodiment

Another manufacturing method of the semiconductor acceleration sensor shown in FIG. 9 will be explained referring to FIGS. 13A to 13C. The manufacturing method in the sixth embodiment is modified from the method shown in FIGS. 6A to 6D in the second embodiment.

Figure 6A:
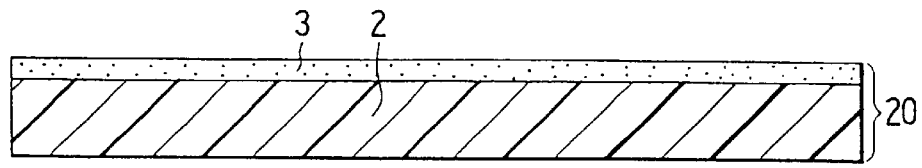
FIGS. 6A to 6D are cross-sectional views showing a manufacturing method of a semiconductor acceleration sensor in a second preferred embodiment in a stepwise manner.
Figure 6B:
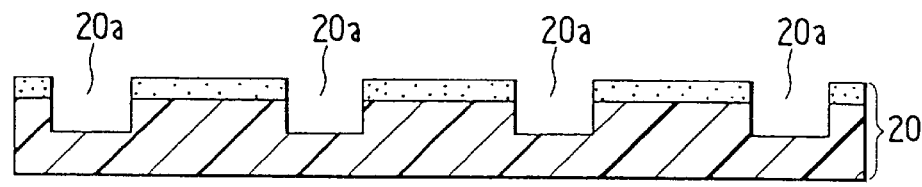
Figure 6C:
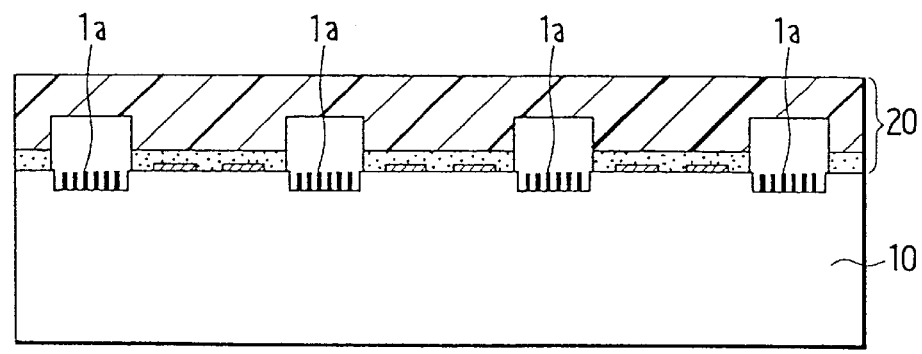
Figure 6D:
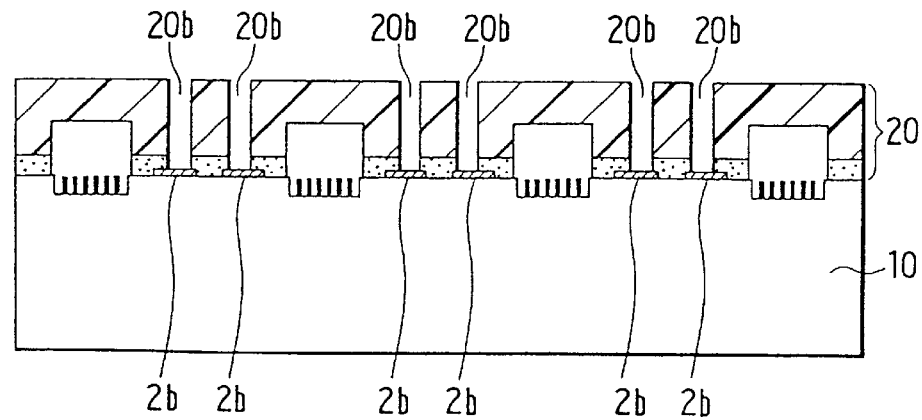
Figure 13A:
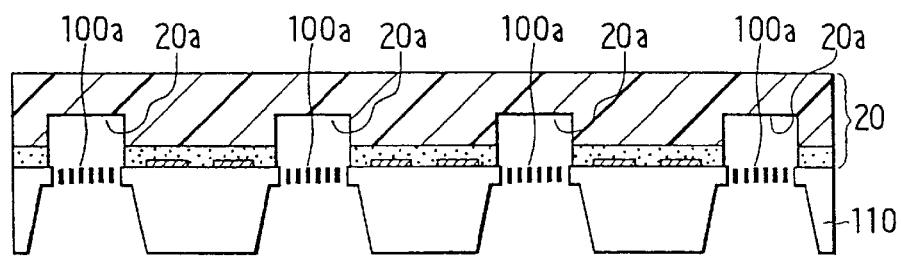
FIGS. 13A to 13C are cross-sectional views showing another manufacturing method of the acceleration sensor shown in FIG. 9, in a sixth preferred embodiment.
Figure 13B:
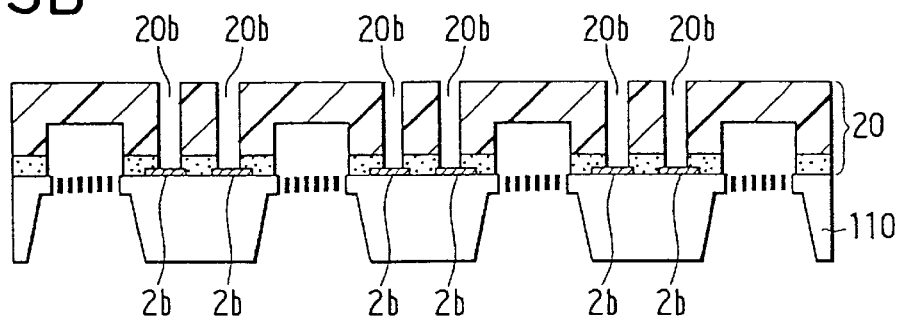
Figure 13C:
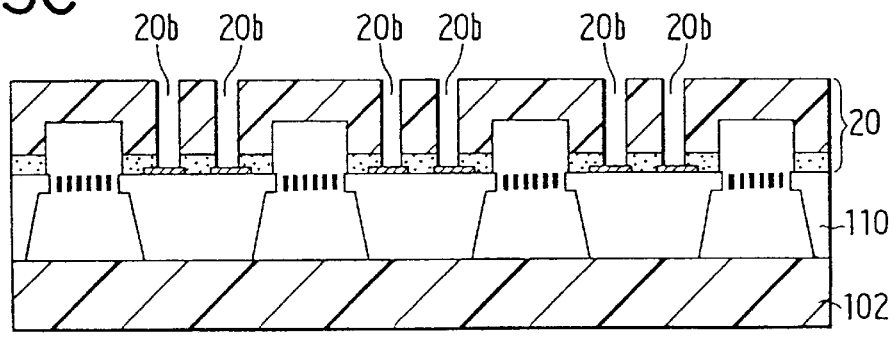

First, at a step shown in FIG. 13A, the heat resisting adhesive sheet 20, which is formed by the steps shown in FIGS. 6A and 6B to have the recesses 20a, is bonded to the main surface of the semiconductor wafer 110. The procedure is substantially the same as that of the step shown in FIG. 6C. Next, at a step shown in FIG. 13B, the contact holes 20b for wire-bonding are formed at positions corresponding to the pads 100b in substantially the same manner as that shown in FIG. 6D. Then, at a step shown in FIG. 13C, the second heat resisting resin sheet 102 is bonded to the back surface of the semiconductor wafer 110 substantially in the same manner as described in the fifth embodiment referring to FIG. 10C. After that, as in the fifth embodiment, the wafer 110 is divided into chips by dicing-cut, and finally, the semiconductor acceleration sensor shown in FIG. 9 is completed. Accordingly, the same effects as those in the fifth embodiment can be achieved.

Seventh Embodiment

Another manufacturing method of the semiconductor acceleration sensor shown in FIG. 9 different from those in the fifth and sixth embodiments will be explained referring to FIGS. 14A to 14C. The manufacturing method in the seventh embodiment is modified from that in the third embodiment explained referring to FIGS. 7A to 7D.

Figure 14A:
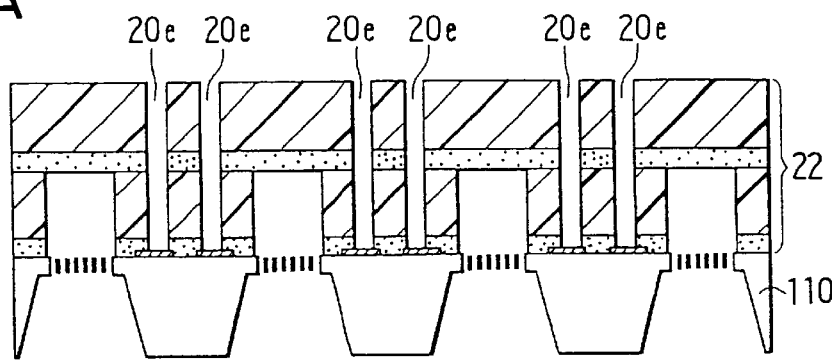
FIGS. 14A to 14C are cross-sectional views showing another manufacturing method of the acceleration sensor shown in FIG. 9, in a seventh preferred embodiment.

First, at a step shown in FIG. 14A, the heat resisting adhesive sheet 22, which are formed by the steps shown in FIGS. 7A, 7B, and 7C, is bonded to the main surface of the semiconductor wafer 110. The procedure is the substantially the same as that of the step shown in FIG. 7D. In this embodiment, the heat resisting resin sheet 2a of the heat resisting adhesive sheet 22 corresponds to the first heat resisting resin sheet 2a.

Figure 14B:
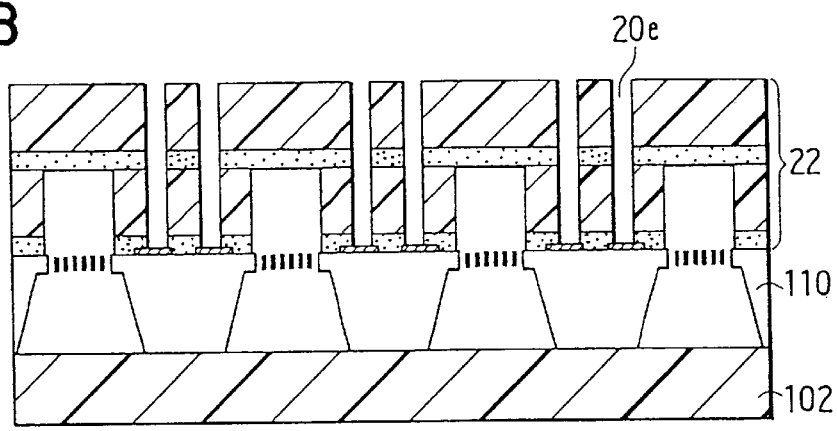
Figure 14C:
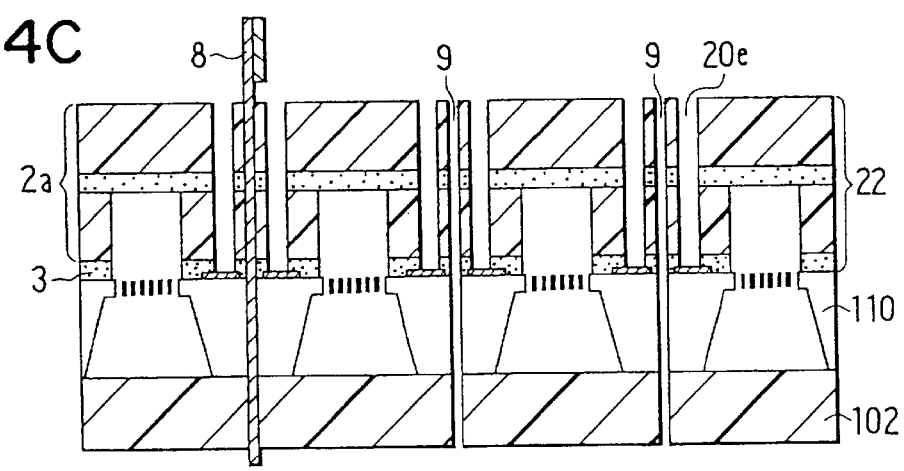

Next, as a step shown in FIG. 14B, the second heat resisting resin sheet 102 is bonded to the back surface of the semiconductor wafer 110 substantially in the same manner as the step explained in the fifth embodiment referring to FIG. 10C. After that, similarly to the fifth embodiment, dicing-cut is carried out so that the wafer 110 is divided into individual chips as shown in FIG. 14C, and finally, the semiconductor acceleration sensor shown in FIG. 9 is completed. Accordingly, the same effects as those in the fifth embodiment can be achieved.

Eighth Embodiment

Figure 15:
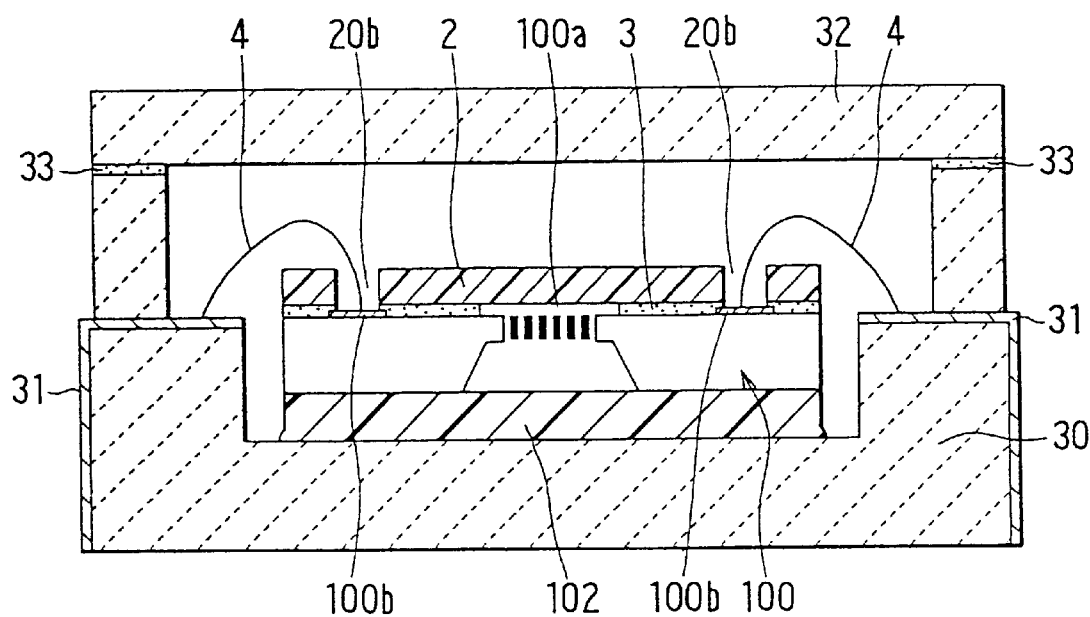
FIG. 15 is a cross-sectional view showing a semiconductor acceleration sensor in an eighth preferred embodiment.

In the eighth embodiment, the sensor chip 100 shown in FIG. 9 is not molded with resin, but accommodated in a ceramic package. That is, in the eighth embodiment, the both-surface exposed type sensor chip 100 is applied to the structure in the fourth embodiment. FIG. 15 shows the semiconductor acceleration sensor in this embodiment.

The constitution of the sensor chip 100 that is covered with the first and second heat resisting resin sheets 2, 102 is substantially the same as that shown in FIG. 9. The sensor chip 100 is fixedly accommodated in a recess portion of a ceramic package body 30 with the second heat resisting resin sheet 102 adhering to the inside wall of the recess portion.

The first and second heat resisting resin sheets 2, 102 have heat resistant characteristics resistible to a heat treatment temperature for fixing the sensor chip 100 to the package. That is, in the manufacturing method of the semiconductor acceleration sensor having a constitution described above, when the sensor chip 100 is fixed to the package body 30, a heat treatment is performed at approximately 180° C. At the bonding step for the wires 4, a heat treatment is performed at approximately 150° C. Further, when a ceramic lid portion 32 is fixed to the package body 30 by adhesive 33, a heat treatment is performed at approximately 180° C.

Despite theses heat treatments, likewise, because the heat resisting temperatures of the polyimide base members constituting the first and second heat resisting resin sheets 2, 102 and silicone adhesive constituting the heat resisting adhesive 3 are higher than the heat treatment temperatures described above, the semiconductor acceleration sensor is manufactured while keeping the shapes of the heat resisting resin sheets 2, 102. Further, in this embodiment, a problem such that adhesive adheres to the beam structure 100a does not occur since the second heat resisting resin sheet 102 exists. It is apparent that the manufacturing methods and constitutions in the sixth and seventh embodiments can be applied to this embodiment.

When the silicone adhesive includes silanol radicals (Si—OH), the heat resistivity can be more improved. Polyimide adhesive may be used in place of the silicone adhesive. The second heat resisting resin sheet 102 may be bonded to the semiconductor wafer 110 through heat resisting adhesive that is similar to the heat resisting adhesive 3. Further, the second heat resisting resin sheet 102 may be bonded to either one of the lead frame 5 and the recess portion of the package body 30 through heat resistive adhesive. In this case, the heat resistive adhesive is prevented from adhering to the beam structure 100a by the second heat resisting resin sheet 102 interposed therebetween.

The present invention is not limited to the sensor element including a movable part such as a beams structure, and may be applied to other semiconductor elements including, for instance, an air-bridge connecting structure having small mechanical strength.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor chip having a semiconductor structure that is exposed on a main surface of the semiconductor chip;
   a pad provided on the semiconductor chip for an electrical connection;
   a wire connected to the pad;
   a main side protective resin sheet disposed on the main surface of the semiconductor chip to cover the semiconductor structure and having an opening from which the pad is exposed and the wire protrudes;
   a main side heat resisting adhesive disposed between the main side protective resin sheet and the semiconductor chip for fixing the main side protective resin sheet to the semiconductor chip,
   wherein the main side protective resin sheet and the main side heat resisting adhesive have first and second heat resisting temperatures that are higher than a first temperature capable of fixing the wire to the pad by bonding,
   the pad is surrounded by the main side protective resin sheet forming the opening portion; and
   the main side protective resin sheet continuously extends from a first region covering the semiconductor structure to a second region forming the opening portion;
   a lead frame fixedly holding the semiconductor chip thereon on a side opposite the main side protective resin sheet; and
   a resin member encapsulating the semiconductor chip and the lead frame therein with a specific shape,
   wherein the first and second heat resisting temperatures are higher than second and third temperatures, the second temperature being capable of fixing the semiconductor chip onto the lead frame, the third temperature being capable of molding the resin member into the specific shape.

2. The semiconductor device of claim 1, further comprising:
   a package body fixedly accommodating the semiconductor chip and the main side protective resin sheet therein; and
   a lid member fixed to the package body for covering the semiconductor chip,
   wherein the first and second heat resisting temperatures are higher than second and third temperatures, the second temperature being capable of fixing the semiconductor chip to the package body, the third temperature being capable of fixing the led member to the package body.

3. The semiconductor device of claim 2, further comprising connection means extending in the package body and electrically connected to the pad through the wire,
   wherein the first and second heat resisting temperatures are higher than a temperature that is capable of connecting the connection means to the wire by bonding.

4. The semiconductor device of claim 1, further comprising:
   a back side protective resin sheet bonded to the semiconductor chip on a side opposite the main side protective resin sheet; and
   a lead frame fixedly holding the semiconductor chip thereon through the back side protective resin sheet,
   wherein the semiconductor structure is exposed on the main surface and on a back surface opposite the main surface of the semiconductor chip, and is covered by the main side and back side protective resin sheets; and
   wherein the first and second heat resisting temperatures and a third heat resisting temperature of the back side protective resin sheet are higher than the first temperature and a second temperature capable of fixing the semiconductor chip to the lead frame.

5. The semiconductor device of claim 4, wherein at least one of the main side and back side protective resin sheets is transparent.

6. The semiconductor device of claim 4, wherein the main side and back side protective resin sheets are made of polyimide.

7. The semiconductor device of claim 4, wherein the back side protective resin sheet is bonded to the semiconductor chip by a back side heat resisting adhesive.

8. The semiconductor device of claim 7, wherein the main side and back side heat resisting adhesives includes silicone adhesive.

9. The semiconductor device of claim 1, wherein the main side protective resin sheet is made of polyimide.

10. The semiconductor device of claim 1, wherein the main side heat resisting adhesive includes a silicone adhesive.

11. A semiconductor device comprising:
    a semiconductor chip;
    a main side protective resin sheet made of a heat resisting resin and disposed on the semiconductor chip;
    a main side heat resisting adhesive disposed between the main side protective resin sheet and the semiconductor chip for fixing the main side protective resin sheet to the semiconductor chip;
    a resin member encapsulating the semiconductor chip and the main side protective resin sheet therein with a specific shape,
    wherein the main side protective resin sheet and the main side heat resisting adhesive have first and second heat resisting temperatures that are higher than a molding temperature capable of molding the resin member into the specific shape, and
    a back side protective resin sheet bonded to the semiconductor chip on a side opposite the main side protective resin sheet,
    wherein the back side protective resin sheet has a third heat resisting temperature that is higher than the molding temperature.

12. The semiconductor device of claim 11, wherein at least one of the main side and back side protective resin sheets is transparent.

13. The semiconductor device of claim 11, wherein the main side and back side protective resin sheets are made of polyimide.

14. The semiconductor device of claim 11, wherein the back side protective resin sheet is bonded to the semiconductor chip by a back side heat resisting adhesive.

15. The semiconductor device of claim 14, wherein the main side and back side heat resisting adhesives includes silicone adhesive.

16. The semiconductor device of claim 11, wherein the main side protective resin sheet is made of polyimide.

17. The semiconductor device of claim 11, wherein the main side heat resisting adhesive includes a silicone adhesive.

18. A semiconductor device comprising:

a semiconductor chip;

a main side heat resisting adhesive disposed on the semiconductor chip;

a main side protective resin sheet made of a heat resisting resin and fixed to the semiconductor chip with the main side heat resisting adhesive interposed therebetween;

a package fixedly accommodating the semiconductor chip and the main side protective resin sheet therein, wherein the main side protective resin sheet and the main side heat resisting adhesive have first and second heat resisting temperatures are higher than a fixing temperature capable of fixing the semiconductor chip to the package, and a back side protective resin sheet bonded to the semiconductor chip on a side opposite the main side protective resin sheet, wherein the semiconductor chip is fixed to the package by the back side protective resin sheet; and wherein the back side protective resin sheet has a third heat resisting temperature that is higher than said fixing temperature.

19. The semiconductor device of claim 18, wherein at least one of the main side and back side protective resin sheets is transparent.

20. The semiconductor device of claim 18, wherein the main side and back side protective resin sheets are made of polyimide.

21. The semiconductor device of claim 20, wherein the back side protective resin sheet is bonded to the semiconductor chip by a back side heat resisting adhesive.

22. The semiconductor device of claim 21, wherein the main side and back side heat resisting adhesives includes silicone adhesive.

23. The semiconductor device of claim 18, wherein the main side protective resin sheet is made of polyimide.

24. The semiconductor device of claim 18, wherein the main side heat resisting adhesive includes a silicone adhesive.

25. The semiconductor device of claim 1, wherein the main side protective resin sheet has a flat resin sheet surface at a side opposite the semiconductor chip, the flat resin sheet surface extending approximately in parallel with the main surface of the semiconductor chip from the first region to the second region.

26. The semiconductor device of claim 1, wherein a space is defined between the semiconductor structure and the main side protective resin sheet.

27. The semiconductor device of claim 1, wherein the main side heat resisting adhesive is exposed to a side wall forming the opening from which the pad is exposed.

28. The semiconductor device of claim 1, wherein the main side heat resisting adhesive is inevitably disposed between the main side protective resin sheet and the semiconductor chip to prevent the main side protective resin sheet from contacting the semiconductor chip directly.

29. The semiconductor device of claim 1, wherein the first and second heat resisting temperatures of the main side protective resin sheet and the main side heat resisting adhesive are higher than approximately 150° C.

30. The semiconductor device of claim 11, wherein the main side heat resisting adhesive is inevitably disposed between the main side protective resin sheet and the semiconductor chip to prevent the main side protective resin, sheet from contacting the semiconductor chip directly.

31. The semiconductor device of claim 11, wherein: the semiconductor chip has a semiconductor structure; and the main side protective resin sheet is a cover covering the semiconductor structure while defining a space between the semiconductor structure and the main side protective resin sheet.

32. The semiconductor device of claim 11, wherein; the first and second heat resisting temperatures of the main side protective resin sheet and the main side heat resisting adhesive sheet are higher than approximately 180° C.

33. The semiconductor device of claim 18, wherein the main side heat resisting adhesive is inevitably disposed between the main side protective resin sheet and the semiconductor chip to prevent the main side protective resin sheet from contacting the semiconductor chip directly.

34. The semiconductor device of claim 18, wherein the semiconductor chip has a semiconductor structure; and the main side protective resin sheet is a cover covering thle semiconductor structure while defining a space between the semiconductor structure and the main side protective resin sheet.

35. The semiconductor device of claim 18, wherein the first and second heat resisting temperatures of the main side protective resin sheet and the main side heat resisting adhesive are higher than approximately 150° C.

36. The semiconductor device of claim 18, wherein the package forms a hermetically sealed chamber for holding the semiconductor chip therein.

* * * * *